United States Patent [19]

Suhar

[11] Patent Number: 4,600,857

[45] Date of Patent: Jul. 15, 1986

[54] LAMP WITH INTEGRAL HEAT SINK

[76] Inventor: Craig Suhar, 2471 Chaney Cir., Youngstown, Ohio 44509

[21] Appl. No.: 597,058

[22] Filed: Apr. 5, 1984

[51] Int. Cl.[4] .......................... H01K 1/28; H01K 1/58; H05K 3/20

[52] U.S. Cl. .......................................... 313/35; 313/40; 313/44; 313/45; 313/315; 219/540

[58] Field of Search ..................... 313/44, 45, 35, 315, 313/40; 219/540, 355, 354 (U.S. only)

[56] References Cited

U.S. PATENT DOCUMENTS

| | | | |
|---|---|---|---|
| 1,897,586 | 2/1933 | Pirani . | |
| 2,190,313 | 2/1940 | Dinnick . | |
| 2,629,836 | 2/1953 | Deri | 313/45 X |
| 3,087,083 | 4/1963 | Katz | 313/44 |
| 3,543,841 | 12/1970 | Eastman | 313/44 X |

FOREIGN PATENT DOCUMENTS

| | | | |
|---|---|---|---|
| 921034 | 4/1947 | France | 313/45 |

*Primary Examiner*—Palmer C. DeMeo

*Attorney, Agent, or Firm*—Harpman & Harpman

[57] ABSTRACT

A lamp having an integral heat sink that gives off heat as well as light during operation. The heat sink intersects the surface of the lamp adjacent the lamp filament for maximum heat transfer effect with minimum light radiation loss.

4 Claims, 5 Drawing Figures

LAMP WITH INTEGRAL HEAT SINK

BACKGROUND OF THE INVENTION

1. Technical Field

This invention relates to incandescent lamps used to give off heat as well as light.

2. Description of the Prior Art

Prior art devices of this type have utilized cooling fins or the like to reduce the internal temperature of the lamp to prevent undesirable condensation within. See for example U.S. Pat. Nos. 1,897,586, 3,087,083, and 2,190,313.

In U.S. Pat. No. 1,897,586 a gaseous electric discharge device is disclosed with a plurality of fins or veins secured to the lamp body by an annular clamp on the outer surface thereof.

U.S. Pat. No. 3,087,083 discloses a vapor lamp and radiator that is secured to the surface of a vapor lamp to reduce lamp operating temperatures.

In U.S. Pat. No. 2,190,313, a lamp with integral cooling radiation is disclosed wherein a metal cap forms the end portion of the lamp body with an integral fin extending from the cap outwardly and inwardly cooling the lamp to prevent condensation.

Applicant's invention utilizes a disc-shaped heat sink that intersects the lamp's outer surface and surrounds the lamp filament extending outwarding at 360° therefrom forming a highly effective heat sink within the lamp and a radiant fin outside the lamp.

SUMMARY OF THE INVENTION

A lamp with integral heat sink utilized to give off heat as well as light by intersecting the lamp surface with a relatively thin disc that absorbs the radiant heat given off by the lamp filament and transfers the heat to the surrounding air.

DESCRIPTION OF THE PREFERRED EMBODIMENT

Figure 4:
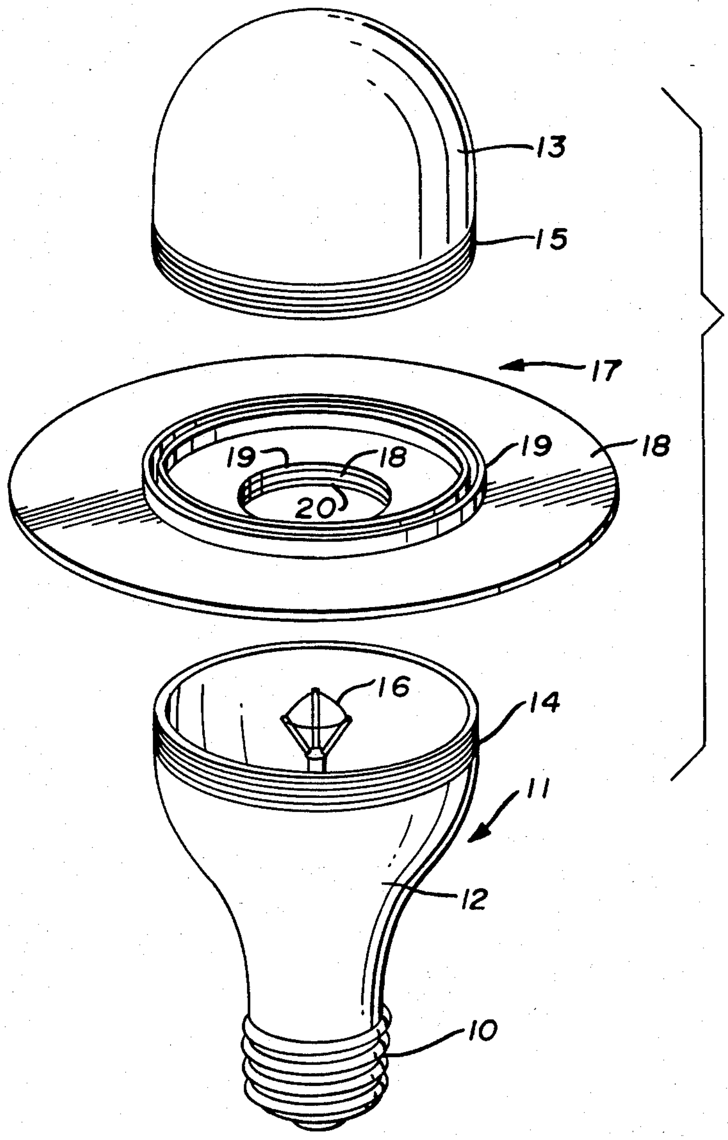
FIG. 4 is an exploded perspective view of the lamp in FIG. 1.
Figure 5:
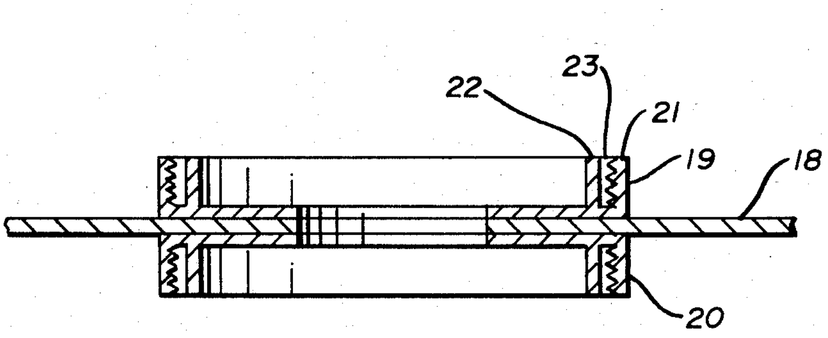
FIG. 5 is a section on lines 5—5 of FIG. 4 of a portion of the lamp.

A lamp can be seen in FIG. 4 of the drawings comprising a standard lamp base 10 having an externally threaded surface that can be secured within a standard lamp socket, not shown, as is well known in the art.

A lamp body 11, preferably of translucent glass, has first and second lamp portions 12 and 13. The first lamp portion 12 extends from said lamp base 10 in the traditional bulb shape to its maximum diameter having a threaded pattern 14 formed inwardly from its annular edge. The second lamp portion 13 of the lamp body defines a dome-shape having a maximum diameter equal to that of said first lamp portion 12. A secondary thread pattern 15 is formed on the second lamp portion 13 inwardly from its annular edge. A lamp filament 16 is supported within the lamp body 11 from the lamp base 10 as is well known in the art so that the lamp filament 16 is centered and aligned on the horizontal plane of the annular edges of said lamp bodies 12 and 13 heretofore described. A heat transfer fin 17 is comprised of an annular disc 18 having an overall diameter greater than that of said lamp body 11 and having a central annular aperture slightly larger than the diameter of said lamp filament 16. A pair of spaced oppositely disposed flanged apertured discs 19 and 20 are secured to opposite sides of said disc 18 aligned on their apertures. The first flanged aperture disc 19 has a peripheral flange 21 and an inner flange 22. The peripheral flange 21 is internally threaded at 23 and the inner annular flange 22 is resilient so as to help seal the second lamp portion 13 registrably within. The second flanged apertured disc 20 is identical to said first flanged apertured disc and it is registrable with the first lamp portion 12 in the same manner as the flanged apertured disc 19 as heretofore described. The lamp is assembled by threading the second flanged aperture disc 20 onto the first lamp portion 12 and then threading the second lamp portion 13 to the flanged apertured disc 19 in an airless environment.

Figure 1:
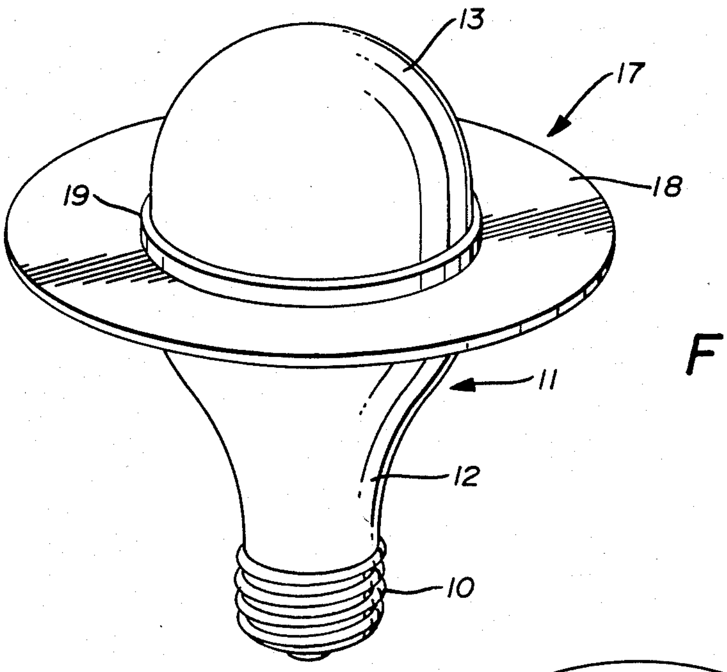
FIG. 1 is a perspective view of the lamp.
Figure 2:
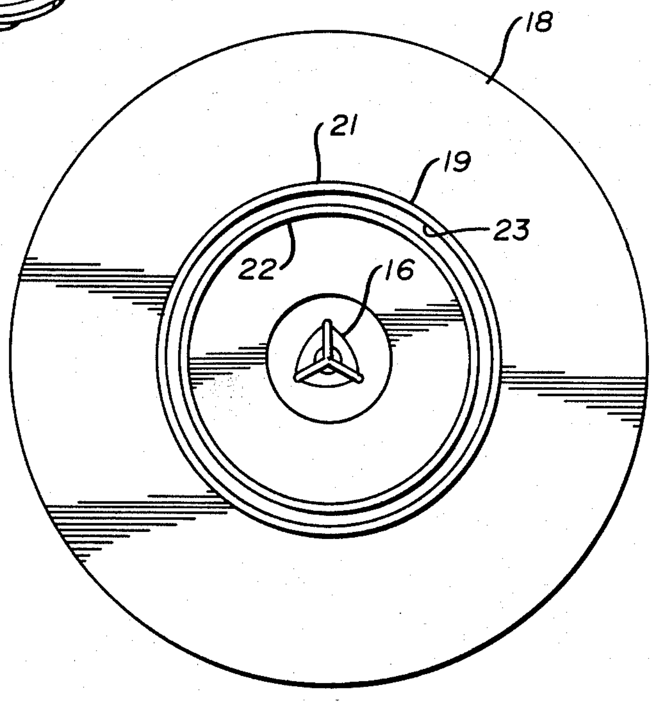
FIG. 2 is a top plan view of the lamp of FIG. 1.

The lamp, once assembled, will position the lamp filament 16 within the central aperture of the disc 18 which will extend outwardly from the lamp body's maximum diameter providing a relatively large surface area of the disc to be exposed to the atmosphere as best seen in FIGS. 1 and 2 of the drawings.

In operation, the lamp will operate in the standard manner with the lamp filament 16 enclosed in an airless environment radiating both heat and light as an electric current is supplied therethrough as is well known in the art. The heat transfer fin 17 will collect the heat energy given off and effectively transfer the same to the surrounding air while not greatly diminishing the amount of light given off.

Figure 3:
FIG. 3 is an enlarged cross section of a portion of the lamp.

Referring now to FIG. 3 of the drawings, a portion of an alternate heat transfer fin 24 can be seen having a hollow interior 25 that is filled with a heat transfer material having high properties of rapid heat transfer such as ethylene glycol (ethylene alcohol glycol 1,2, ethanedial (CH2OHCH2OH)).

It will be apparent to those skilled in the art that an adhesive can be used as a supplement to or in place of the thread patterns 15 and 23 to secure and seal the lamp portions 12 and 13 to the heat transfer fin 17. Such an adhesive is known in the art as green No. 25 cement containing durite, marble flour, varnish mix, alcohol, and calco green (dye).

It will thus be seen that a new and useful lamp with integral heat sink has been illustrated and described and that various changes and modifications may be made therein without departing from the spirit of the invention and having thus described my invention.

What I claim is:

1. A lamp with integral heat sink for radiation of heat comprising a lamp base, a translucent lamp body having first and second lamp portions, said first lamp portion secured to said lamp base, a filament within said lamp body, a centrally apertured heat transfer fin intersecting the lamp body and extending into said lamp body adjacent said filament, means for securing said heat transfer fin to said first and second lamp portions.

2. The lamp with integral heat sink of claim 1 wherein said means for securing said heat transfer fin to said first and second lamp portions comprises spaced, oppositely disposed flanged apertured discs secured to said heat transfer, said discs having a peripheral flange and an inner annular flange registrable with said first and second lamp portions respectively.

3. The lamp with integral heat sink of claim 2 wherein said peripheral flange is internally threaded and said inner annular flange is resilient and said first and second lamp portions are threaded inwardly from their respective annular edges and registrable within said spaced oppositely disposed flanged apertured discs forming a lamp enclosure with said heat transfer fin surrounding said filament within said lamp body.

4. A lamp with integral heat sink for radiation of heat comprising a lamp base, a translucent lamp body having first and second lamp portions, said first lamp portion secured to said lamp base, a filament within said lamp body, a centrally apertured heat transfer fin intersecting the lamp body and extending into said lamp body adjacent said filament, means for securing said heat transfer fin to said first and second lamp portions and wherein said transfer fin is hollow and filled with a heat transfer material from a group represented as ethylene glycol (ethylene alcohol glycol 1,3, ethanedial ($CH_2OHCH_2OH$)).

* * * * *